(12) United States Patent
Qian et al.

(10) Patent No.: US 12,064,945 B2
(45) Date of Patent: Aug. 20, 2024

(54) DISPLAY PANEL AND MANUFACTURING METHOD THEREOF, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Zhengkun Qian, Beijing (CN); Hengzhen Liang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/637,774

(22) PCT Filed: Feb. 8, 2021

(86) PCT No.: PCT/CN2021/075976
§ 371 (c)(1),
(2) Date: Feb. 23, 2022

(87) PCT Pub. No.: WO2021/164611
PCT Pub. Date: Aug. 26, 2021

(65) Prior Publication Data
US 2022/0314574 A1    Oct. 6, 2022

(30) Foreign Application Priority Data
Feb. 21, 2020  (CN) .......................... 202010107515.7

(51) Int. Cl.
*B32B 3/24*     (2006.01)
*B32B 3/26*     (2006.01)
(Continued)

(52) U.S. Cl.
CPC ............... *B32B 3/266* (2013.01); *B32B 3/30* (2013.01); *B32B 5/18* (2013.01); *B32B 7/12* (2013.01);
(Continued)

(58) Field of Classification Search
CPC ..................................................... B32B 3/266
See application file for complete search history.

(56) References Cited

U.S. PATENT DOCUMENTS

| | | |
|---|---|---|
| 10,534,221 B1 | 1/2020 | Zhu |
| 2007/0121318 A1 | 5/2007 | Nanbu |
| | (Continued) | |

FOREIGN PATENT DOCUMENTS

| | | |
|---|---|---|
| CN | 207529356 U | 6/2018 |
| CN | 108770300 A | 11/2018 |
| | (Continued) | |

OTHER PUBLICATIONS

China Office Action, mailed May 8, 2021, from Chinese Patent Application No. 202010107515.7.
(Continued)

*Primary Examiner* — William P Watkins, III
(74) *Attorney, Agent, or Firm* — Workman Nydegger

(57) ABSTRACT

A display panel and a manufacturing method thereof, and a display device. The display panel comprises: a display module having an opening extending therethrough in a direction perpendicular to a light-exiting surface; and a light-shielding structure comprises a light-blocking layer positioned at an inner wall of the opening of the display module. The light-blocking layer can effectively prevent light from leaking from a film layer of the display module where the opening extends therethrough.

11 Claims, 3 Drawing Sheets

(51) Int. Cl.
*B32B 3/30* (2006.01)
*B32B 5/18* (2006.01)
*B32B 7/12* (2006.01)
*B32B 15/04* (2006.01)
*B32B 37/16* (2006.01)
*B32B 38/00* (2006.01)
*H05K 7/20* (2006.01)
*H04N 23/53* (2023.01)

(52) U.S. Cl.
CPC ............ *B32B 15/046* (2013.01); *B32B 37/16* (2013.01); *B32B 38/0004* (2013.01); *H05K 7/20963* (2013.01); *B32B 2457/20* (2013.01); *H04N 23/53* (2023.01); *Y10T 428/24322* (2015.01); *Y10T 428/24339* (2015.01)

(56) References Cited

U.S. PATENT DOCUMENTS

| | | |
|---|---|---|
| 2021/0013285 A1 | 1/2021 | Hsieh |
| 2021/0368657 A1 | 11/2021 | Xie et al. |

FOREIGN PATENT DOCUMENTS

| | | |
|---|---|---|
| CN | 108881543 A | 11/2018 |
| CN | 109273513 A | 1/2019 |
| CN | 109459880 A | 3/2019 |
| CN | 109461374 A | 3/2019 |
| CN | 109683399 A | 4/2019 |
| CN | 109782482 A | 5/2019 |
| CN | 208922027 U | 5/2019 |
| CN | 110225159 A | 9/2019 |
| CN | 110233167 A | 9/2019 |
| CN | 110289301 A | 9/2019 |
| CN | 209642753 U | 11/2019 |
| CN | 110646962 A | 1/2020 |
| CN | 110737131 A | 1/2020 |
| CN | 209964110 U | 1/2020 |
| CN | 111179746 A | 5/2020 |

OTHER PUBLICATIONS

China Office Action, mailed Oct. 20, 2021, from Chinese Patent Application No. 202010107515.7.

DISPLAY PANEL AND MANUFACTURING METHOD THEREOF, AND DISPLAY DEVICE

CROSS REFERENCE TO RELATED APPLICATIONS

The present disclosure is a national phase entry under 35 U.S.C. § 371 of International Application No. PCT/CN2021/075976, filed on Feb. 8, 2021, which claims priority of Chinese Patent Application No. 202010107515.7, filed with the China National Intellectual Property Administration (CNIPA) on Feb. 21, 2020, and entitled "DISPLAY PANEL, METHOD FOR PREPARING DISPLAY PANEL, AND DISPLAY DEVICE", the entire content of which is incorporated herein by reference.

FIELD

The present disclosure relates to the technical field of display, in particular to a display panel, a method for preparing the display panel, and a display device.

BACKGROUND

With the increasing popularity of smart phones, people have higher and higher requirements for a screen ratio. Under the trend of full screen display, at present, a front-facing camera achieves a shooting function through punching on a display module. However, punching on other film layers such as a Panel may cause a light leakage problem on a display panel, therefore, at present, a problem of light leakage on sides of a camera in a full screen needs to be solved.

SUMMARY

Embodiments of the present disclosure provide a display panel, including:
- a display module provided with an open hole penetrating through the display module in a direction perpendicular to a light-exiting face of the display module; and
- a shading structure, including a light-blocking layer on an inner wall of the open hole.

Optionally, the above display panel provided by embodiments of the present disclosure, further includes:
- a cover plate on a light-exiting side of the display module; and
- a heat dissipation film on a side of the display module facing away from the cover plate.

The heat dissipation film includes a foam layer and a metal layer which are stacked. The metal layer is on a side of the foam layer facing away from the display module. The metal layer is provided with a first through hole opposite to the open hole. The orthographic projection of the first through hole on the cover plate covers the orthographic projection of the open hole on the cover plate. The foam layer includes a first structure part between the display module and the metal layer and a second structure part on the inner wall of the open hole. The light-blocking layer includes the second structure part.

Optionally, in the above display panel provided by embodiments of the present disclosure, a material of the foam layer includes a shading material.

Optionally, the above display panel provided by embodiments of the present disclosure, further includes:
- a shading layer on a side of the cover plate close to the display module.

The shading layer includes a second through hole. The orthographic projection of the open hole on the cover plate covers the orthographic projection of the second through hole on the cover plate.

Optionally, in the above display panel provided by embodiments of the present disclosure, an area of the orthographic projection of the second through hole on the cover plate is smaller than an area of the orthographic projection of the open hole on the cover plate.

Optionally, in the above display panel provided by embodiments of the present disclosure, the foam layer further includes a third structure part. The third structure part includes a first end and a second end. The first end is connected with an end of the second structure part close to the shading layer, and the second end is connected with the shading layer.

Optionally, in the above display panel provided by embodiments of the present disclosure, the second structure part completely covers the inner wall of the open hole. The first structure part, the second structure part and the third structure part are of a continuous integrated structure.

Optionally, in the above display panel provided by embodiments of the present disclosure, the third structure part has an arc protruding towards one side of the shading layer.

Optionally, in the above display panel provided by embodiments of the present disclosure, the open hole is a circular hole. The circular hole includes a symmetric axis in the direction perpendicular to the light-exiting face of the display module. A symmetric axis of the first through hole in the direction perpendicular to the light-exiting face of the display module and a symmetric axis of the second through hole in the direction perpendicular to the light-exiting face of the display panel both coincide with the symmetric axis of the open hole.

Optionally, in the above display panel provided by embodiments of the present disclosure, an area of the orthographic projection of the first through hole on the cover plate is greater than an area of the orthographic projection of the open hole on the cover plate.

Optionally, in the above display panel provided by embodiments of the present disclosure, a side of the foam layer facing away from the metal layer has a bonding layer, and the foam layer is bonded to the display module through the bonding layer.

In another aspect, the present disclosure further provides a method for preparing a display panel, including:
- forming a display module, and forming a through open hole in a direction perpendicular to a light-exiting face of the display module; and
- attaching a light-blocking layer to an inner wall of the open hole of the display module.

Optionally, in the above method of embodiments of the present disclosure, the attaching the light-blocking layer to the inner wall of the open hole of the display module, includes:
- forming a heat dissipation film, wherein the heat dissipation film includes a foam layer and a metal layer which are stacked, a first through hole is formed in the metal layer, the foam layer includes a first structure part and a second structure part, the first structure part is between the display module and the metal layer, and a part in the foam layer for corresponding to the open hole forms a plurality of cutting lines distributed around a central axis of the first through hole and perpendicular to the central axis of the first through hole, so as to form the second structure part distributed around the central axis of the first through hole; and attaching the heat dissipation film to a side of the display module facing away from the light-exiting face of the display module, wherein a first through hole of the metal layer and the open hole of the display module are oppositely arranged, the second structure in the foam layer is bent towards the inner wall of the open hole and attached to the inner wall of the open hole, and the light-blocking layer includes the second structure part.

Optionally, in the above method of the embodiments of the present disclosure, in a radial direction of the first through hole, and in a direction from the central axis of the first through hole to a direction of an edge of the first through hole, a length of the cutting line is greater than or equal to a thickness of the display module and smaller than a radius of the first through hole.

Optionally, in the above method of the embodiments of the present disclosure, the foam layer has a third through hole, the third through hole and the first through hole are coaxially arranged, the third through hole communicates with the all the cutting lines, and a diameter of the third through hole is smaller than a diameter of the open hole.

In another aspect, the present disclosure further provides a display device, including any display panel in the above technical solution and a shooting module in an open hole of a display module in the display panel.

DETAILED DESCRIPTION OF THE EMBODIMENTS

The technical solutions of the embodiments of the present disclosure will be described clearly and completely with reference to accompanying drawings of the embodiments of the present disclosure. Obviously, the described embodiments are part of, rather than all of, embodiments of the present disclosure. Based on the embodiments of the present disclosure, all other embodiments obtained by those ordinarily skilled in the art without creative labor fall within the protection scope of the present disclosure.

Figure 1:
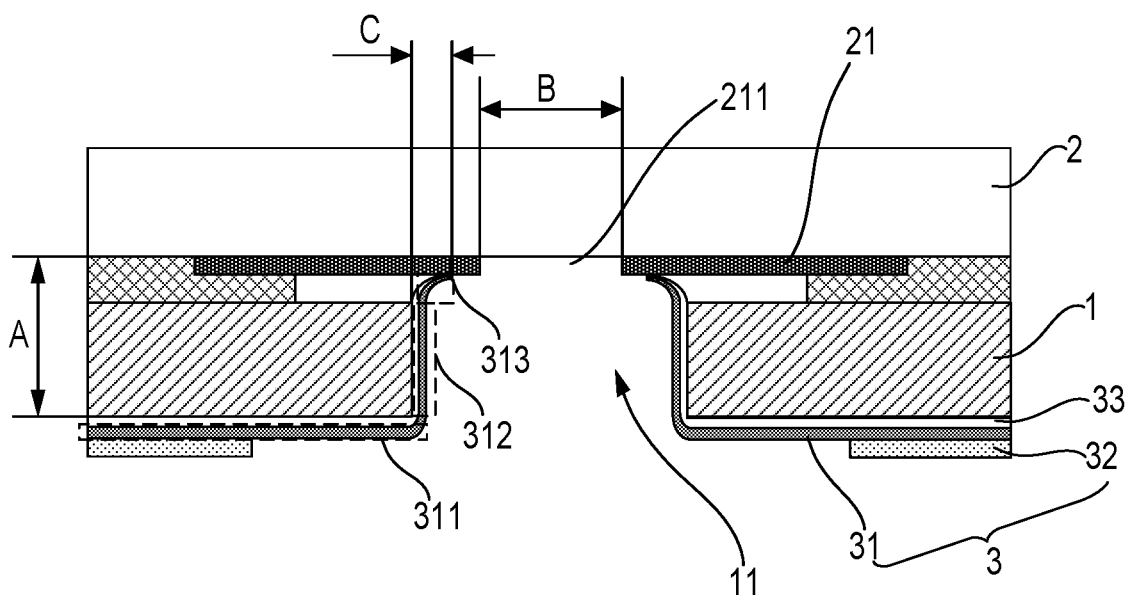
FIG. 1 is a schematic structural diagram of a display panel provided by an embodiment of the present disclosure.

As shown in FIG. 1, a display panel provided by embodiments of the present disclosure, includes:

a display module 1 provided with an open hole 11 penetrating through the display module in a direction perpendicular to a light-exiting face of the display module; and a shading structure, including a light-blocking layer 312 on an inner wall of the open hole 11 of the display module 1.

In the above display panel provided by embodiments of the present disclosure, the open hole 11 is formed in a display area of the display module 1. The open hole 11 penetrates through the display module 1 in the direction perpendicular to the light-exiting face of the display module 1, and is configured to mount a shooting module. The shooting module may include a camera. The camera can be mounted in the open hole 11 of the display module 1. A shading structure is arranged in the open hole 11 of the display module 1. The shading structure includes a light-blocking layer 312 attached to the inner wall of the open hole 11. The light-blocking layer 312 is attached to the inner wall of the open hole 11 of the display module 1, and covers the inner wall of the open hole 1. After a product is illuminated, the light-blocking layer 312 can effectively shade light leakage of a film layer of the display module 1 in the open hole 11, then a problem of light leakage appears at a lateral edge of the shooting module after the product is illuminated is solved, and a structure is simple and reliable.

Figure 2:
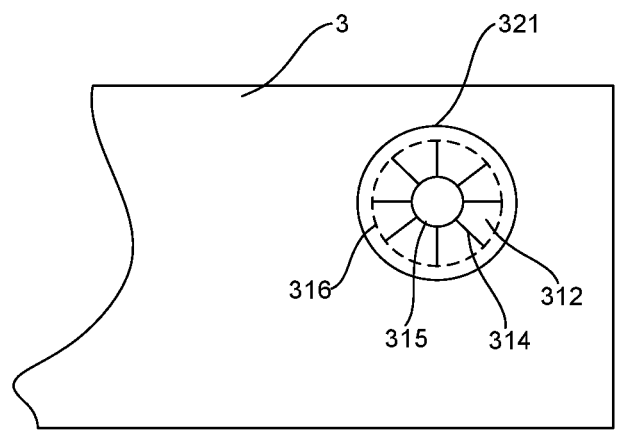
FIG. 2 is a schematic structural diagram of a heat dissipation film provided by an embodiment of the present disclosure.

As shown in FIG. 1 and FIG. 2, the above display panel provided by embodiments of the present disclosure, further includes:

a cover plate 2 on a light-exiting side of the display module 1, for example, the cover plate may be a glass cover plate; and a heat dissipation film 3 on a side of the display module 1 facing away from the cover plate 2.

The heat dissipation film 3 includes a foam layer 31 and a metal layer 32 which are stacked. The metal layer 32 is on a side of the foam layer 32 facing away from the display module. A first through hole 321 opposite to the open hole 11 is formed in the metal layer 32. An orthographic projection of the first through hole 321 on the cover plate 2 covers an orthographic projection of the open hole 11 on the cover plate 2. The foam layer 32 includes a first structure part 311 between the display module 1 and the metal layer 32 and a second structure part 312 on the inner wall of the open hole 11 of the display module 1. The light-blocking layer includes the second structure part 312.

In the above display panel provided by embodiments of the present disclosure, the first through hole 321 penetrates through the metal layer 32. The second structure part 312 of the foam layer 31 corresponds to the open hole 11. The second structure part 312 may be bent towards an interior of the open hole 11 in a direction perpendicular to a display face and attached to the inner wall of the open hole 11 to form the light-blocking layer. The first structure part 311 and the second structure part 312 are of an integrated structure. A part of the foam layer 31 directly forms the light-blocking layer shading the inner wall of the open hole 11. The structure is reliable, preparation is simple. A part in the heat dissipation film 3 opposite to the open hole 11 of the display module directly forms the light-blocking layer to shade the inner wall of the open hole 11, an extra film layer structure does not need to be additionally arranged, and a thickness of the display panel cannot be increased.

Optionally, in the above display panel provided by embodiments of the present disclosure, a material of the foam layer 31 may be a shading material, so as to enable the second structure part 312 of the foam layer 31 to form the light-blocking layer with better shading performance on the inner wall of the open hole 11, which is more beneficial to avoiding light leakage of the lateral side of the open hole 11.

Optionally, the above display panel provided by embodiments of the present disclosure, as shown in FIG. 1, further includes:

a shading layer 21 on a side of the cover plate 2 close to the display module 1.

The shading layer 21 includes a second through hole 211. The orthographic projection of the open hole 11 on the cover plate covers the orthographic projection of the second through hole 211 on the cover plate.

In order to shade an edge of the open hole 11 on the side of the light-exiting face of the display module 1, the shading layer 21 is arranged on a side of the cover plate 2 facing the display module 1. A second through hole 211 opposite to the open hole 11 is formed in the shading layer 21. The second through hole 211 is opposite to the open hole 11 to enable a shooting module to realize a lighting shooting function. The shading layer 21 may perform shading on an edge part of the open hole 11 on a light-exiting side of the display module 1, so as to avoid light leakage of the light-exiting face of the display panel on the edge of the open hole 11.

Optionally, in the above display panel provided by embodiments of the present disclosure, the open hole 11 of the display module 1 is generally a circular hole. The open hole 11 includes a symmetric axis in the direction perpendicular to the light-exiting face of the display module 1. The first through hole 321 may be arranged to be circular. The second through hole 211 may be arranged to be a circular hole. A symmetric axis of the first through hole 321 in the direction perpendicular to the light-exiting face of the display panel and a symmetric axis of the second through hole 211 in the direction perpendicular to the light-exiting face of the display panel both coincide with the symmetric axis of the open hole 11. That is, a central axis of the second through hole 211 and a central axis of the first through hole 321 may coincide with a central axis of the open hole 11.

Optionally, in the above display panel provided by embodiments of the present disclosure, it may be arranged that an area of the orthographic projection of the second through hole 211 on the cover plate 2 is smaller than an area of the orthographic projection of the open hole 11 on the cover plate 2. That is, a diameter B (as shown in FIG. 1) of the second through hole 211 is smaller than a diameter of the open hole 11 of the display module 1, shading leakproofness can be enhanced, and a lateral side of the shooting module is better shaded on the light-exiting face side of the display module 1.

In conjunction with FIG. 1, referring to FIG. 2, in the above display panel provided by embodiments of the present disclosure, in order to avoid tilting of an edge of a first through hole 321 in a metal layer 32, it may be arranged that a diameter of the orthographic projection of the first through hole 321 on the cover plate 2 is greater than a diameter of the orthographic projection of the open hole 11 on the cover plate.

The diameter of the first through hole in the metal layer 21 is greater than the diameter of the open hole 11 of the display module 1. The second structure part 312 is bent towards an interior of the open hole 11 to form a bent line 316 matched with an edge of the open hole 11. That is, the diameter of the first through hole 321 in the metal layer 32 is greater than the diameter of the bent lines of the second structure part 312 in the foam layer 31. A certain distance is arranged between the edge of the first through hole 321 in the metal layer 32 and the bent lines of the second structure part 312 in the foam layer 31. The edge of the first through hole 321 in the metal layer 32 cannot be affected by deformation of a bent position of the second structure part 312 in the foam layer 31 after being attached with the foam layer 31, and it can be guaranteed that the metal layer 32 is well attached with the foam layer 31.

Optionally, in the above display panel provided by embodiments of the present disclosure, as shown in FIG. 1, the foam layer 31 further includes a third structure part 313. The third structure part 313 includes a first end and a second end. The first end is connected with an end of the second structure part 312 close to the shading layer 21, and the second end is connected with the shading layer 21. Connection here refers to direct contact or connection through other layers. The third structure part 313 is arranged at a free end of the second structure part 312, and the third structure part 313 connects the second structure part 312 with the shading layer 21, which is beneficial to enhancing shading leakproofness of the lateral side of the open hole 11 in the display module.

Optionally, in the above display panel provided by embodiments of the present disclosure, the second structure part 312 completely covers the inner wall of the open hole 11. The first structure part 311, the second structure part 312 and the third structure part 313 are of a continuous integrated structure.

In the above display panel provided by embodiments of the present disclosure, a part in the foam layer 31 corresponding to the open hole 11 can be uniformly divided around the central axis of the open hole 11 to form the structure part 312. The structure part 312 is uniformly attached to the inner wall of the open hole 11 to uniformly shade the inner wall of the open hole 11. An excessive gap between the adjacent second structure parts cannot appear, and the shading performance is better.

The second structure part 312 and the first structure part 311 are of the continuous integrated structure. The second structure part 312 is bent towards the interior of the open hole 11 to be attached to the inner wall of the open hole 11. Tiny cracks existing in the second structure part 312 (namely a cutting line 314 between the second structure part 312) cannot expose too much of the inner wall of the open hole 11, and it can be considered that the second structure part 312 can completely cover the inner wall of the open hole 11. The free end of the second structure part 312 points to the center of the second through hole 211 in the shading layer 21. The third structure part 313 can be considered as a part of the second structure part 312 at the free end extending to the cover plate 2 and in lap joint with the shading layer 21. The third structure part 313 is connected with the shading layer 21 on the cover plate 2, connection is compact, the shading leakproofness is ensured, a better shading effect is achieved, light leakage of the edge of the open hole 11 of the display module 1 is avoided. The third structure part 313 extends to the cover plate 2 and is connected with the cover plate 2, and the soundness is better.

In the above display panel provided by embodiments of the present disclosure, a length size of the second structure part 312 and the third structure part 313 is arranged according to a total sum of a thickness size A (as shown in FIG. 1) of the display module 1 in a direction perpendicular to a light-exiting face and a lap joint length C of the third structure part 313 in lap joint with the cover plate 2, so that the second end of the third structure part 313 can be in lap joint with the shading layer 21 of the cover plate 2 and does not extend into the second through hole 211 of the shading layer 21, thus the shading leakproofness is ensured, and the shooting function of the shooting module cannot be affected.

The length of the structure part 312 can be arranged to the same as the thickness size A of the display module 1. As the structural characteristics of the third structure part 313, the third structure part 313 cannot be completely attached at a corner between the inner wall of the open hole 11 of the display module 1 and the cover plate 2 according to the shape of the corner, namely, the third structure part 313 has an arc protruding towards to the shading layer 21, thus when the length of the third structure part 313 is set according to the lap-joint length C of the third structure part 313 in lap joint with the cover plate 2, a tolerance preserved size during attachment will be reserved.

In the above display panel provided by embodiments of the present disclosure, as shown in FIG. 1, a side of the foam layer 31 facing away from the metal layer 32 can have a bonding layer 33, and the foam layer 31 can be bonded to the display module 1 through the bonding layer 33. The bonding layer 33 is a glue layer. The foam layer 31 can be bonded to the display module 1 through the glue layer, bonding is convenient and simple, and stability is good.

For example, the metal layer 32 can be copper foil. A material of the metal layer 32 can further be aluminum, golden or sliver, or other metal materials, which is not limited in the embodiments.

Based on the same inventive concept, embodiments of the present disclosure further provide a display device, including any display panel provided in the above embodiments, and a shooting module located in the open hole of the display module. The display device may be a mobile phone, a tablet personnel computer, a television, a display, a laptop, a camera photo frame, a navigator and other any products or parts with a display function. The implementation of the display device can refer to that of the embodiments of the above display panel, and repetitions will not be repeated.

Figure 3:
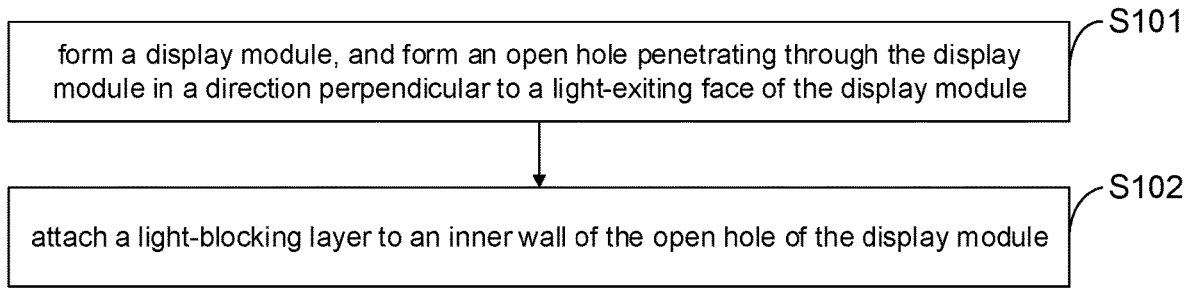
FIG. 3 is a schematic flow diagram of a method for preparing a display panel provided by an embodiment of the present disclosure.

Based on the same inventive concept, referring to FIG. 3, embodiments of the present disclosure further provide a method for preparing a display panel which includes the following operations.

Operation S101, a display module is formed, and a through open hole is formed in a direction perpendicular to a light-exiting face of the display module.

Operation S102, a light-blocking layer is attached to an inner wall of the open hole of the display module.

Figure 4:
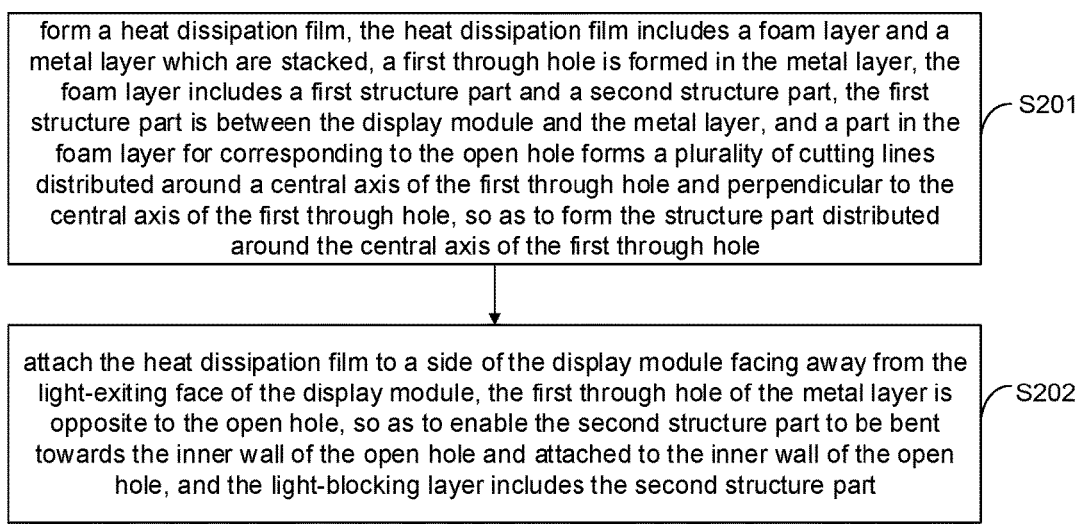
FIG. 4 is a specific schematic flow diagram of a method for preparing a display panel provided by an embodiment of the present disclosure.

As shown in FIG. 4, the attaching the light-blocking layer to the inner wall of the open hole of the display module in above S102, includes the following operations.

Operation S201, a heat dissipation film 3 is formed. As shown in FIG. 1 and FIG. 2, the heat dissipation film 3 includes a foam layer 31 and a metal layer 31 which are stacked. A first through hole 321 is formed in the metal layer 32. The foam layer 31 includes a first structure part 311 and a second structure part 312. The first structure part 311 is between the display module 1 and the metal layer 32. A part in the foam layer 31 used for corresponding to the open hole 11 forms a plurality of cutting lines 314 distributed around a central axis of the first through hole 321 and perpendicular to the central axis of the first through hole 321, so as to form the second structure part 312 distributed around the central axis of the first through hole 321.

A length of each cutting line 314 is smaller than a radius of the first through hole 321. An end of the cutting line 314 facing the first through hole 321 does not need to be in contact with an edge of the first through hole 321. According to the need, after the heat dissipation film 3 is aligned and attached to the display module 1, the length of the cutting line 314 is set to be greater than or equal to a thickness of the display module 1, namely, one end of the cutting line 314 facing the first through hole 321 is in contact with the edge of the open hole 11 of the display module 1, or exceeds some of the edge of the open hole 11 of the display module 1, the attaching performance of the second structure part 312 with the display module 1 at the bent position can be enhanced, and the cutting line 314 can be arranged according to specific structural needs of products.

Step S202, the heat dissipation film 3 is attached to one side of the display module 1 facing away from a light-exiting face of the display module 1. The first through hole 321 of the metal layer 32 and the open hole 11 of the display module are oppositely arranged, so as to enable the central axis of the first through hole 321 of the metal layer 32 to coincide with the central axis of the open hole 11 of the display module. The second structure part 312 in the foam layer 31 is bent towards the inner wall of the open hole 11 and attached to the inner wall of the open hole 11, and the second structure part 312 forms a light-blocking layer.

As shown in FIG. 2, the foam layer 31 may have a third through hole 315. The third through hole 315 and the first through hole 321 of the metal layer 32 are coaxially arranged. The third through hole 315 communicates with each cutting line 314, and a diameter of the third through hole 315 is smaller than the diameter of the open hole 11 of the display module.

A center of a part in the foam layer 31 corresponding to the open hole 11 of the display module 1 has the third through hole 315. The length of the second structure part 312 of the foam layer 31 can be controlled according to a diameter size of the third through hole 315. The diameter of the third through hole 315 is arranged larger, the length of the second structure part 312 is relatively smaller. The situation that the second structure part 312 extends into a second open hole 211 of a shading layer 21 due to excessive length to affect lighting of a shooting module is avoided.

Figure 5:
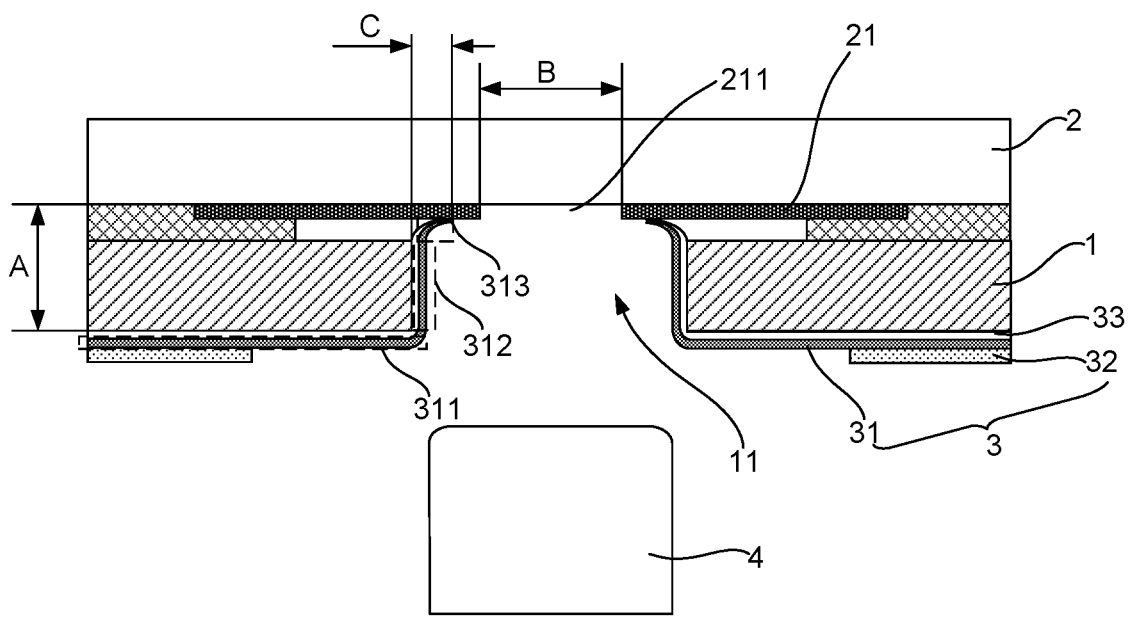
FIG. 5 is a schematic diagram of an attaching rod used in a preparation method provided by an embodiment of the present disclosure.

In the above preparation method, the enabling the second structure part 312 in the foam layer 31 to be bent towards the inner wall of the open hole 11 and attached to the inner wall of the open hole 11 in above operation S202, includes:

as shown in FIG. 5, a cylindrical attaching rod 4 matched with the open hole 11 aligns with a part corresponding to the open hole 11 in the foam layer 31, one end of the attaching rod 4 is controlled to extend into the open hole 11 along the central axis of the open hole 11, and the second structure part in the foam layer 31 is bent into the open hole and attached to the inner wall of the open hole 11. For example, an end face of the end of the attaching rod 4 needing to extend into the open hole 11 of the display module 1 has a round chamfer, thereby facilitating assembly, and facilitating the second structure part 312 being attached with the inner wall of the open hole 11 of the display module 1.

It will be apparent to those skilled in the art that various modifications and variations can be made in the present disclosure without departing from the spirit or scope of the present disclosure. Thus, it is intended that the present disclosure cover the modifications and variations of the present disclosure provided they come within the scope of the appended claims and their equivalents.

What is claimed is:
1. A display panel, comprising:
a display module, provided with an open hole penetrating through the display module in a direction perpendicular to a light-exiting face of the display module;
a shading structure, comprising a light-blocking layer on an inner wall of the open hole;
a cover plate on a light-exiting side of the display module;
a heat dissipation film on a side of the display module facing away from the cover plate; and
a shading layer on a side of the cover plate close to the display module;

wherein the heat dissipation film comprises a foam layer and a metal layer which are stacked;
the metal layer is on a side of the foam layer facing away from the display module;
the metal layer is provided with a first through hole opposite to the open hole;
an orthographic projection of the first through hole on the cover plate covers an orthographic projection of the open hole on the cover plate; and an area of the orthographic projection of the first through hole on the cover plate is greater than an area of the orthographic projection of the open hole on the cover plate;
the shading layer comprises a second through hole, and the orthographic projection of the open hole on the cover plate covers an orthographic projection of the second through hole on the cover plate;
the foam layer comprises:
   a first structure part between the display module and the metal layer;
   a second structure part on the inner wall of the open hole; and
   a third structure part comprising:
     a first end connected with an end of the second structure part close to the shading layer; and
     a second end connected with the shading layer;
wherein the light-blocking layer comprises the second structure part.

2. The display panel according to claim 1, wherein a material of the foam layer comprises a shading material.

3. The display panel according to claim 1, wherein an area of the orthographic projection of the second through hole on the cover plate is smaller than an area of the orthographic projection of the open hole on the cover plate.

4. The display panel according to claim 1, wherein the second structure part completely covers the inner wall of the open hole; and the first structure part, the second structure part and the third structure part are of a continuous integrated structure.

5. The display panel according to claim 4, wherein the third structure part is provided with an arc protruding towards the shading layer.

6. The display panel according to claim 3, wherein the open hole is a circular hole, the open hole is provided with a symmetric axis in the direction perpendicular to the light-exiting face of the display module, and a symmetric axis of the first through hole in the direction perpendicular to the light-exiting face of the display panel and a symmetric axis of the second through hole in the direction perpendicular to the light-exiting face of the display panel both coincide with the symmetric axis of the open hole.

7. The display panel according to claim 1, further comprising:
a bonding layer on a side of the foam layer facing away from the metal layer;
wherein the foam layer is bonded to the display module through the bonding layer.

8. A method for preparing a display panel, comprising:
forming a display module;
forming an open hole penetrating through the display module in a direction perpendicular to a light-exiting face of the display module;
attaching a light-blocking layer to an inner wall of the open hole;
forming a cover plate on a light-exiting side of the display module; and
forming a shading layer on a side of the cover plate close to the display module; wherein the shading layer comprises a second through hole, and an orthographic projection of the open hole on the cover plate covers an orthographic projection of the second through hole on the cover plate;
wherein said attaching the light-blocking layer to the inner wall of the open hole, comprises:
   forming a heat dissipation film on a side of the display module facing away from the cover plate, wherein the heat dissipation film comprises a foam layer and a metal layer which are stacked, the metal layer is on a side of the foam layer facing away from the display module; a first through hole is formed in the metal layer opposite to the open hole, an area of an orthographic projection of the first through hole on the cover plate is greater than an area of the orthographic projection of the open hole on the cover plate; the foam layer comprises a first structure part, a second structure part, and a third structure part; the first structure part is between the display module and the metal layer, a part in the foam layer for corresponding to the open hole forms a plurality of cutting lines distributed around a central axis of the first through hole and perpendicular to the central axis of the first through hole, so as to form the second structure part distributed around the central axis of the first through hole, and the third structure part comprises a first end connected with an end of the second structure part close to the shading layer, and a second end connected with the shading layer; and
   attaching the heat dissipation film to a side of the display module facing away from the light-exiting face of the display module, wherein the first through hole of the metal layer is opposite to the open hole, so as to enable the second structure part to be bent towards the inner wall of the open hole and attached to the inner wall of the open hole, and the light-blocking layer comprises the second structure part.

9. The method according to claim 8, wherein in a radial direction of the first through hole, and in a direction from the central axis of the first through hole to an edge of the first through hole, a length of the cutting line is greater than or equal to a thickness of the display module and smaller than a radius of the first through hole.

10. The method according to claim 9, wherein the foam layer is provided with a third through hole, the third through hole and the first through hole are coaxially arranged, the third through hole communicates with all the cutting lines, and a diameter of the third through hole is smaller than a diameter of the open hole.

11. A display device, comprising the display panel according to claim 1, and a shooting module in the open hole of the display module of the display panel.

* * * * *